United States Patent [19]

Moran

[11] Patent Number: 4,697,149

[45] Date of Patent: Sep. 29, 1987

[54] NMR FLOW IMAGING USING A COMPOSITE EXCITATION FIELD AND MAGNETIC FIELD GRADIENT SEQUENCE

[75] Inventor: Paul R. Moran, Winston-Salem, N.C.

[73] Assignee: Wisconsin Alumni Research Foundation, Madison, Wis.

[21] Appl. No.: 794,652

[22] Filed: Nov. 4, 1985

[51] Int. Cl.$^4$ .......................................... G01R 33/20
[52] U.S. Cl. ..................................... 324/309; 324/306
[58] Field of Search ............... 324/309, 306, 300, 307, 324/312; 128/653

[56] References Cited

U.S. PATENT DOCUMENTS

| | | | |
|---|---|---|---|
| 4,516,075 | 5/1985 | Moran | 324/309 |
| 4,516,582 | 5/1985 | Redington | 128/653 |
| 4,528,985 | 7/1985 | Macovski | 128/653 |
| 4,532,473 | 7/1985 | Wehrli | 324/306 |
| 4,536,712 | 8/1985 | Iwaoka et al. | 324/309 |
| 4,549,140 | 10/1985 | MacFall | 324/309 |
| 4,567,893 | 2/1986 | Charles et al. | 324/309 X |
| 4,587,488 | 5/1986 | Young | 324/309 X |
| 4,595,879 | 6/1986 | Lent et al. | 324/309 |
| 4,602,641 | 7/1986 | Feinberg | 324/309 X |
| 4,609,872 | 9/1986 | O'Donnell | 324/309 X |
| 4,614,195 | 9/1986 | Bottomlay et al. | 324/309 X |
| 4,616,180 | 10/1986 | Compton | 324/309 |

OTHER PUBLICATIONS

K. J. Packer, "The Study of Slow Coherent Molecular Motion by Pulsed Nuclear Magnetic Resonance", *Molecular Physics*, 1969, vol. 17, No. 4, 355-368.

Sadek K. Hilal, Andrew Maudsley, and Frederick Kelcz, Special Project II—*Studies of Two-Dimensional Blood Flow Using Nuclear Magnetic Resonance*, pp. 208-229, privileged communication.

*Primary Examiner*—Tom Noland
*Attorney, Agent, or Firm*—Quarles & Brady

[57] ABSTRACT

An NMR zeugmatographic scanner is modified to provide motion images. During each measurement cycle the paramagnetic nuclei are subjected to a pair of transverse excitation field pulses which are separated by the application of a bi-polar magnetic field gradient which sensitizes the resulting FID signal to motion. The resulting FID signal is processed using an inverse Fourier transformation to produce images of flowing paramagnetic nuclei.

11 Claims, 9 Drawing Figures

NMR FLOW IMAGING USING A COMPOSITE EXCITATION FIELD AND MAGNETIC FIELD GRADIENT SEQUENCE

BACKGROUND OF THE INVENTION

The field of the invention is gyromagnetic resonance spectroscopy, and particularly, nuclear magnetic resonance (NMR) techniques for measuring the properties of materials.

Gyromagnetic resonance spectroscopy is conducted to study nuclei that have magnetic moments and electrons which are in a paramagnetic state. The former is referred to in the art as nuclear magnetic resonance (NMR), and the latter is referred to as paramagnetic resonance (EPR) or electron spin resonance (ESR). There are other forms of gyromagnetic spectroscopy that are practiced less frequently, but are also included in the field of this invention.

Any nucleus which possesses a magnetic moment attempts to align itself with the direction of the magnetic field in which it is located. In doing so, however, the nucleus precesses around this direction at a characteristic angular frequency (Larmor frequency) which is dependent on the strength of the magnetic field and on the properties of the specific nuclear species (the magnetogyric constant $\gamma$ of the nucleus).

When a substance such as human tissue is subjected to a uniform magnetic field (polarizing field $B_O$) the individual magnetic moments of the paramagnetic nuclei in the tissue attempt to align with this field, but precess about it in random order at their characteristic Larmor frequency. A net magnetic moment $M_z$ is produced in the direction of the polarizing field, but the randomly oriented components in the perpendicular plane (x-y plane) cancel one another. If, however, the substance, or tissue, is irradiated with a magnetic field (excitation field $B_1$) which is in the x-y plane and which is near the Larmor frequency, the net aligned moment, $M_z$, can be rotated into the x-y plane to produce a net transverse magnetic moment $M_1$ which is rotating in the x-y plane at the Larmor frequency.

The practical value of this gyromagnetic phenomena resides in the radio signal which is emitted after the excitation signal $B_1$ is terminated. When the excitation signal is removed, an oscillating sine wave is induced in a receiving coil by the rotating field produced by the transverse magnetic moment $M_1$. The frequency of this signal is the Larmor frequency, and its initial amplitude, $A_O$, is determined by the magnitude of $M_1$. The amplitude A of the emission signal (in simple systems) decays in an exponential fashion with time, t:

$$A = A_O e^{-t/T_2}$$

The decay constant $1/T_2$ is a characteristic of the process and it provides valuable information about the substance under study. The time constant $T_2$ is referred to as the "spin-spin relaxation" constant, or the "transverse relaxation" constant, and it measures the rate at which the aligned precession of the nuclei dephase after removal of the excitation signal $B_1$.

Other factors contribute to the amplitude of the free induction decay (FID) signal which is defined by the $T_2$ spin-spin relaxation process. One of these is referred to as the spin-lattice relaxation process which is characterized by the time constant $T_1$. This is also called the longitudinal relaxation process as it describes the recovery of the net magnetic moment M to its equilibrium value $M_O$ along the axis of magnetic polarization (Z). The $T_1$ time constant is longer than $T_2$, much longer in most substances, and its independent measurement is the subject of many gyromagnetic procedures.

The measurements described above are called "pulse NMR measurements." They are divided into a period of excitation and a period of emission. As will be discussed in more detail below, this measurement cycle may be repeated many times to accumulate different data during each cycle or to make the same measurement at different locations in the subject. A variety of preparative excitation techniques are known which involve the application of one or more excitation pulses of varying duration. Such preparative excitation techniques are employed to "sensitize" the subsequently observed free induction decay signal (FID) to a particular phenomenon. Some of these excitation techniques are disclosed in U.S. Pat. Nos. 4,339,716; 4,345,207; 4,021,726 4,115,730 and 3,474,329.

Although NMR measurements are useful in many scientific and engineering fields, their potential use in the field of medicine is enormous. NMR measurements provide a contrast mechanism which is quite different from x-rays, and this enables differences between soft tissues to be observed with NMR which are completely indiscernible with x-rays. In addition, physiological differences can be observed with NMR measurements, whereas x-rays are limited primarily to anatomical studies.

For most medical applications utilizing NMR, an imaging technique must be employed to obtain gyromagnetic information at specific locations in the subject. The foremost NMR imaging technique is referred to as "zeugmatography" and was first proposed by P. C. Lauterbur in a publication "Image Formation by Induced Local Interactions: Examples Employing Nuclear Magnetic Resonance", Nature, Vol. 242, Mar. 16, 1973, pp. 190-191. Zeugmatography employs one or more additional magnetic fields which have the same direction as the polarizing field $B_O$, but which have a nonzero gradient. By varying the strength (G) of these gradients, the net strength of the polarizing field $B_O = B_z + G_x X + G_y Y + G_z Z$ at any location can be varied. As a result, if the frequency response of the FID receiver coil and circuitry is narrowed to respond to a single frequency, $\omega_O$, then gyromagnetic phenomena will be observed only at a location where the net polarizing field $B_O$ is of the proper strength to satisfy the Larmor equation; $\omega_O = \gamma B_O$: where $\omega_O$ is the Larmor frequency at that location.

By "linking" the resulting free induction signal FID with the strengths of the gradients ($G = G_x$, $G_y$, $G_z$) at the moment the signal is generated, the NMR signal is "tagged", or "sensitized", with position information. Such position sensitizing of the NMR signal enables an NMR image to be produced by a series of measurements. Such NMR imaging methods have been classified as point methods, line methods, plane methods and three dimensional methods. These are discussed, for example, by P. Mansfield and P. G. Morris in their book "NMR Imaging in Biomedicine" published in 1982 by Academic Press; New York.

The NMR scanners which implement these techniques are constructed in a variety of sizes. Small, specially designed machines, are employed to examine laboratory animals or to provide images of specific parts of the human body. On the other hand, "whole body" NMR scanners are sufficiently large to receive an entire human body and produce an image of any portion thereof.

In my U.S. Pat. No. 4,516,075 I describe an NMR scanner which produces images indicative of the motion of the gyromagnetic material. This is accomplished by a motion sensitizing step which is interlaced with the normal pulsed NMR measurement cycles. More specifically, a bipolar magnetic field gradient is applied to the gyromagnetic material after the excitation period, but before the subsequent FID signal. The direction of this motion sensitizing magnetic field gradient determines the flow direction in which the subsequent FID signal is sensitized, and the magnitude of the motion in that direction is determined by measuring the phase of the transverse magnetic moment $M_1$. This phase is measured by detecting the component of the FID which is in phase with the excitation signal $B_1$ and by detecting the component which is in quadrature with the excitation signal $B_1$. These signals are digitized and processed along with position information to produce an image which is modulated in intensity as a function of the motion in the sensitized direction.

While this technique is very powerful and is very economical to implement in current NMR scanners, it is susceptible to visual "artifacts" caused by imperfections in the design or manufacture of the NMR scanner which produce phase errors at locations in the region of interest. For example, the excitation coils may introduce slight phase shifts in the excitation field $B_1$ at specific locations throughout the region of interest. Such phase shifts are detected and processed to indicate motion where, in fact, none actually occurred. While such artifacts can be reduced by properly designing the NMR scanner and by filtering out the known errors, such measures increase the complexity and cost of the system.

In my co-pending U.S. patent application Ser. No. 760,354, now U.S. Pat. No. 4,654,591 entitled "NMR Flow Imaging Using Bi-Phasic Excitation Field Gradients" I describe a method and system for imaging motion which is insensitive to phase errors produced by a non-homogeneous excitation field. This technique requires the application of excitation field gradients, and this in turn requires separate excitation field gradient coils and associated drive circuits. These add to the cost of the instrument.

SUMMARY OF THE INVENTION

The present invention relates to an NMR imaging apparatus, and particularly, to a method and means for sensitizing the NMR signals to provide a motion image which is not subject to phase errors in the NMR scanner. More specifically, the present invention is a velocity-selective excitation sequence which includes the application of a first excitation field pulse ($B_{1A}$) followed by the application of a motion sensitizing magnetic field gradient ($U_A$) to produce a net excited and precessing magnetic moment ($M_A$) at each location in the region being imaged, as described in my U. S. Pat. No. 4,516,075. A second excitation field pulse ($B_{1B}$) is then applied such that the net magnetic moment for stationary gyromagnetic material is restored to produce no net precessing magnetic moment. The net precessing magnetic moment of gyromagnetic material which is in motion in the direction of the motion sensitizing magnetic field gradient is not cancelled by this sequence and it produces a subsequent FID signal. The amplitude of the FID signal is a measure of the amount of motion.

A general object of the invention is to measure the motion of gyromagnetic material at any location within a subject. Conventional NMR scanners may be easily modified to provide motion data along with other data collected during the NMR measurement cycle.

Yet another object of the invention is to produce a FID signal which is indicative of gyromagnetic nuclei that are moving, but which is insensitive to stationary gyromagnetic material. Because the net magnetic moment produced in stationary gyromagnetic material by the first half of the excitation sequence is precisely nulled, or cancelled, by the second half of the excitation sequence, the stationary gyromagnetic material does not contribute to the subsequent FID signal. Of course, the motion measurement cycle of the present invention can be interlaced with other, more conventional, measurement cycles which produce FID signals that indicate the density of both the stationary and moving gyromagnetic material.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

DESCRIPTION OF THE PREFERRED EMBODIMENT

Figure 1:
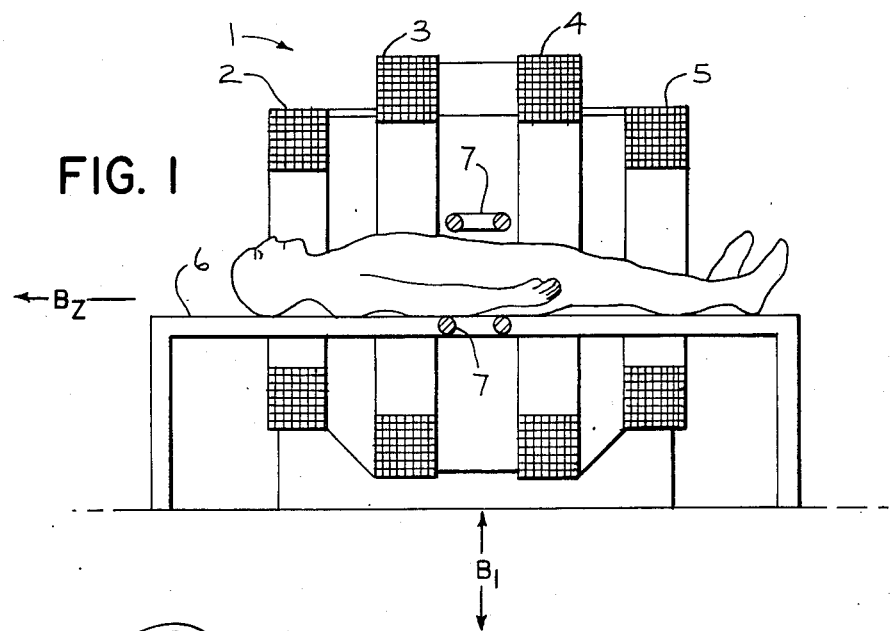
FIG. 1 is a schematic elevation view of an NMR scanner which employs the present invention.

Although the present invention may be easily implemented in a variety of gyromagnetic scanner or NMR spectrometer structures, the preferred embodiment of the invention employs a large electromagnet to generate the polarizing field. Referring particularly to FIG. 1, this polarizing magnet 1 is comprised of four circular cylindrical segments 2–5 of sufficient size to receive a table 6. A patient may be placed on the table 6 and any portion of his body may be scanned by suitably positioning him with respect to excitation coils 7. The polarizing magnet 1 produces a strong magnetic field $B_z$ which is constant and homogeneous within the space defiend by the excitation coils 7. The excitation coils 7 produce an excitation field $B_1$ which is in the transverse plane, perpendicular to the polarizing field $B_z$. The excitation field $B_1$ oscillates at a radio frequency $W_0$ and it is applied as one or more pulses. The coils 7 are then switched to a passive mode in which they operate as receivers for the NMR signals produced in the patient's body.

Figure 2A:
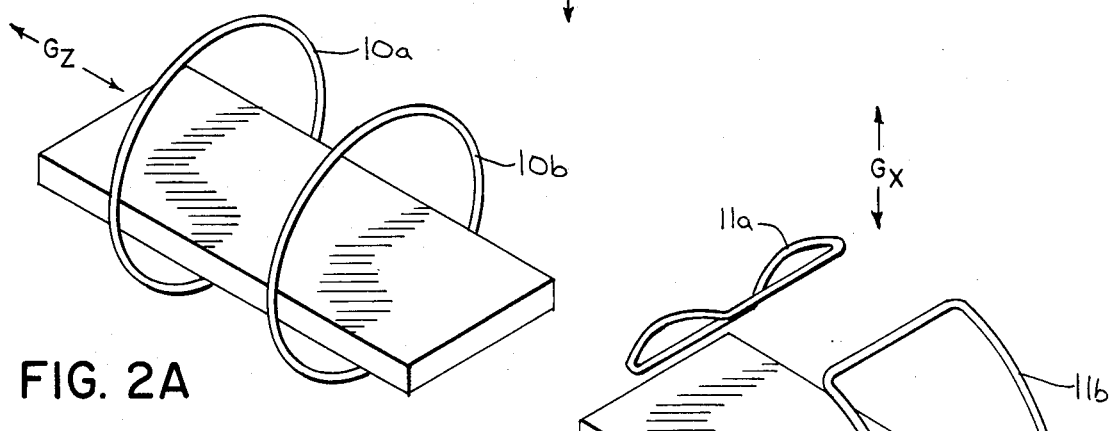
FIGS. 2A–2C are perspective views of the gradient coils which form part of the scanner of FIG. 1.
Figure 2B:
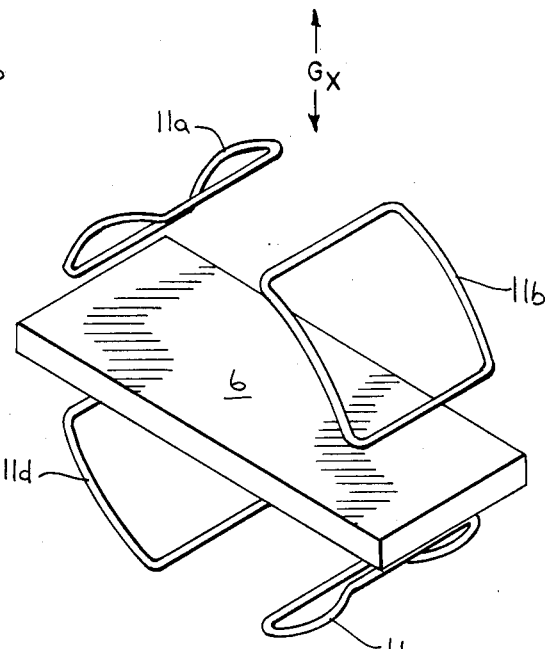
Figure 2C:
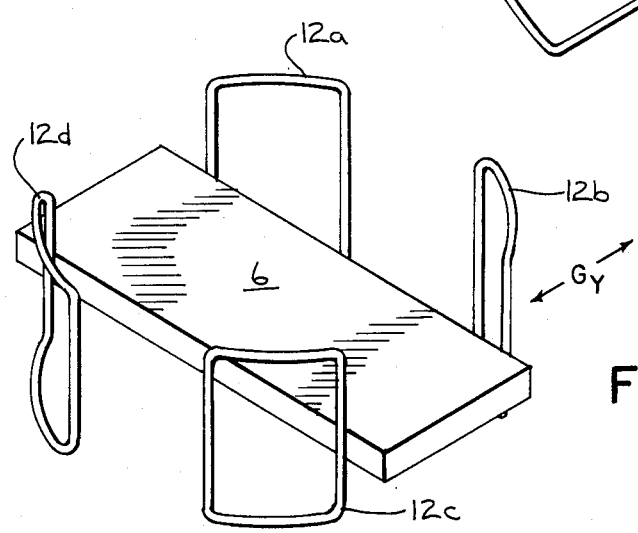

Referring to FIGS. 2A–2C, three sets of gradient field coils are also formed around the table 6. A set of Z gradient field coils 10a and 10b produce a magnetic field ($G_z \cdot Z$) which is directed along the z axis of the machine, but which has a strength that changes as a function of position along the z axis. This field is additive to the polarizing magnetic field $B_z$ to provide a total field $B_O$ which varies in strength substantially linearly (i.e., $G_z \cdot Z$) as a function of Z position on the table 6.

Referring to FIG. 2B, a second set of gradient field coils 11a–11d produce a magnetic field ($G_x \cdot X$) which is directed along the z axis of the machine, but which has a strength that changes as a function of position along the x axis. This field is additive to the polarizing magnetic field $B_z$ to provide a total field $B_O$ which varies in strength substantially linearly as a function of x position on the table 6.

Referring to FIG. 2C, a third set of gradient field coils 12a–12d produce a magnetic field ($G_y \cdot Y$) which is directed along the z axis of the machine, but which has a strength that changes as a function of position along the Y axis. This field is additive to the polarizing magnetic field $B_z$ to provide a total field $B_O$ which varies in strength substantially linearly as a function of y position on the table 6.

The generation and control of the polarizing magnetic field $B_z$ and the field gradients $G_x$, $G_y$ and $G_z$ is well-known in the art and is employed in existing NMR scanners.

Figure 3:
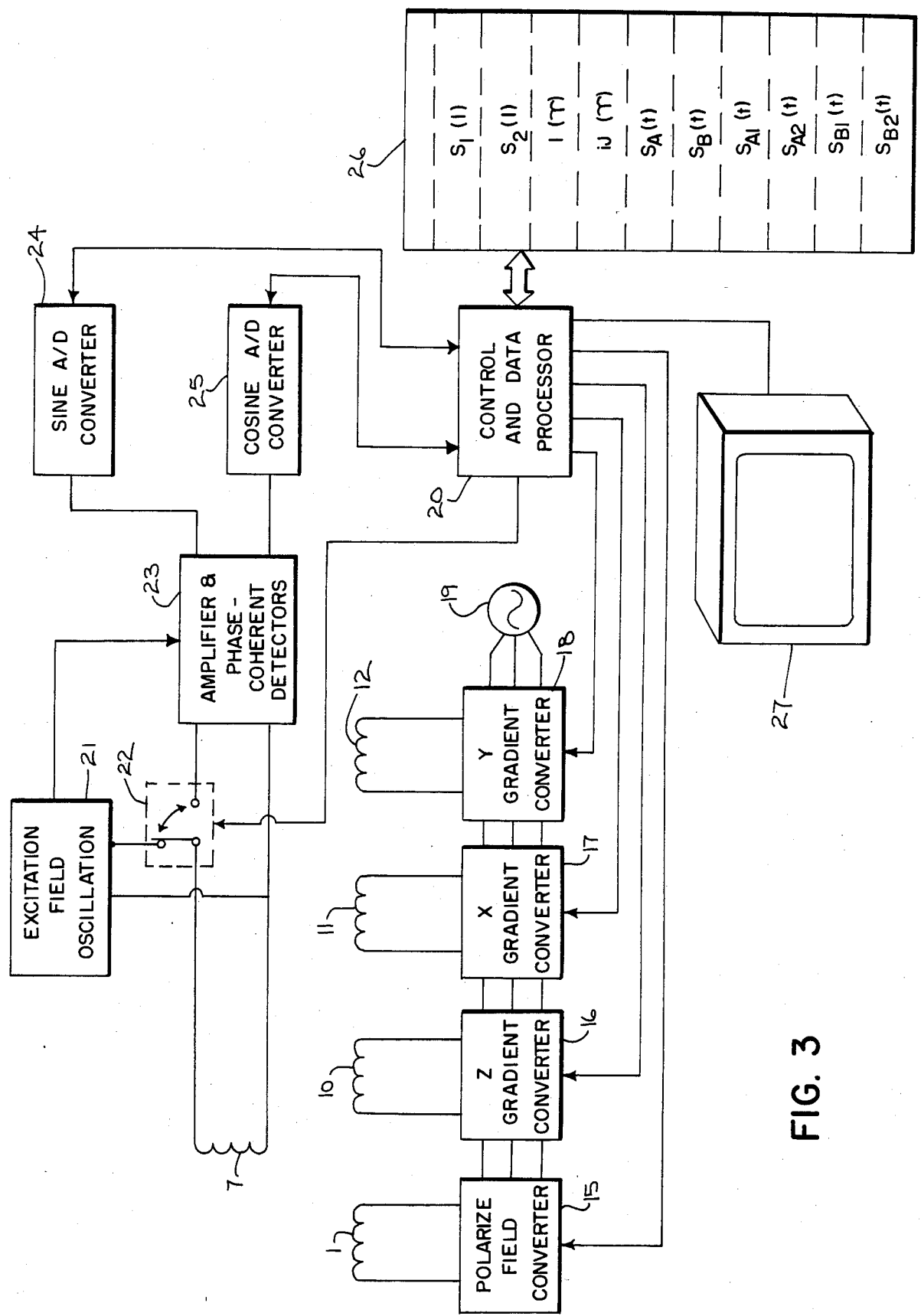
FIG. 3 is an electrical block diagram of the control system which forms part of the scanner of FIG. 1.

Referring particularly to FIG. 3, the control system for the NMR scanner includes a set of four static power converters 15–18 which connect to an a.c. power source 19. The static power converters 15–18 produce d.c. currents for the respective coils 1, 10, 11 and 12 at levels determined by commands received from a processors 20. The polarity, or direction, of the d.c. currents produced for the gradient field coils 10–12 can also be controlled. Thus, both the magnitude and the direction of the gradient fields in the x, y and z direction can be switched on command from the processor 20.

The excitation winding 7 is driven by a radio frequency oscillator 21 when an electronic switch 22 is toggled to its active position. The oscillator 21 is tuned to the Larmor frequency and the excitation winding 7 produces an excitation field $B_1$ which is transverse to the polarizing field $B_z$. The switch 22 is controlled by the processor 20 and when the switch 22 is toggled to its passive position, the excitation winding 7 is coupled to the input of an amplifier and phase-coherent detector circuit 23. The NMR signals in the patient induce a voltage in the excitation winding 7 which is amplified and demodulated in the circuit 23. The oscillator 21 provides a reference signal to the circuit 23 that enables one phase-coherent detector therein to produce an in-phase, or sine, free induction decay (FID) signal to an analog-to-digital converter 24. A second phase-coherent detector produces an orthogonal, or cosine, FID signal to an analog-to-digital converter 25.

The free induction decay signals produced by the phase-coherent detector 23 are digitized by the A/D converters 24 and 25. The sample rate of this digitization is controlled by the processor 20, and the digital numbers which are produced by the A/D converters 24 and 25 are input to the processor 20 and stored in a memory 26. The processor 20 also stores values indicative of the gradient field strengths at the moment the FID signals are produced, and in this manner, the FID signals are linked to a specific position within the patient.

To practice the present invention the elements of the NMR scanner described above are operated in a series of measurement cycles in which the FID produced during each measurement cycle is sensitized to motion. This sensitization is carried out by performing the measurement cycle depicted in FIG. 4.

Figure 4:
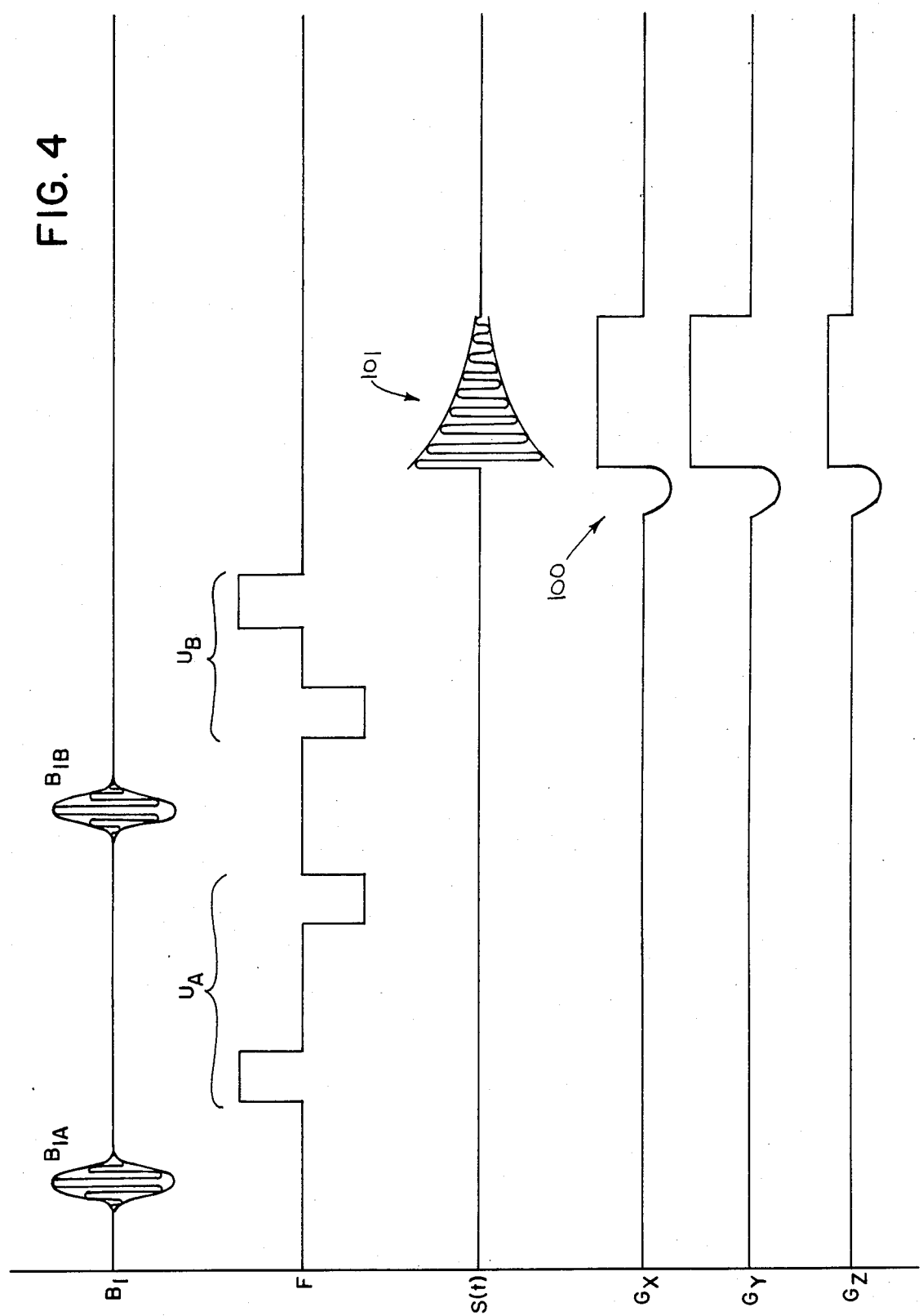
FIG. 4 is a graphic illustration of a preferred measurement cycle performed according to the present invention.

The measurement cycle in FIG. 4 includes a first excitation field pulse $B_{1A}$ which produces a net transverse magnetic moment in the precessing gyromagnetic material throughout the region of interest. A bi-polar magnetic field gradient $U_A$ is then applied as taught in my U.S. Pat. No. 4,516,075. This bi-polar magnetic field gradient is produced by the gradient coils 10–12 and it has both a magnitude and direction which is determined by the amount of current supplied to each gradient coil 10–12. The field is produced first with one polarity, and then with the opposite polarity to sensitize the gyromagnetic material to motion in the direction of the field gradient. As taught in my above-cited patent, the phase of the resulting FID signal is modulated by the moving gyromagnetic material and the amplitude of the FID signal is a measure of the density of the gyromagnetic material—both moving and stationary. Anomalies in the scanner—which produce phase errors, thus produce errors in the measurement of motion using this prior sequence.

To overcome this problem a second excitation field pulse $B_{1B}$ and a second bi-polar magnetic field gradient $U_B$ are applied prior to the generation of the FID signal. The second excitation field pulse $B_{1B}$ has the same strength and duration as the first pulse $B_{1A}$, however, the phase of the radio frequency excitation signal is either in phase or 180 degrees out of phase with the first pulse $B_{1A}$ as will be described further below. The second bi-polar magnetic field gradient $U_B$ has the same direction as the first bi-polar magnetic field gradient $U_A$, however, its strength is preferrably one-half that of $U_A$ and its polarity is reversed. As indicated at 100, the appropriate field gradients $G_x$, $G_y$ and $G_z$ are then applied and the FID signal 101 is produced, digitized and stored.

To implement the invention the sequence shown in FIG. 4 is executed twice for each measurement cycle. During the first sequence the phase of the first excitation pulse $B_{1A}$ is set to plus 90 degrees and the phase of the second excitation pulse $B_{1B}$ is set to minus 90 degrees. Then during the second sequence, the phase of both excitation pulses $B_{1A}$ and $B_{1B}$ are set to zero degrees. During the first sequence, therefore, the magnetizations are 180 degrees out of phase and during the second sequence these are in phase.

As indicated above, the magnitude and duration of the excitation pulses $B_{1A}$ and $B_{1B}$ are the same. In addition, in the preferred embodiment these excitation pulses produce relatively small amounts of transverse magnetization or, as expressed in the art, "small-tip-angle". As a result, two "independent" transverse magnetizations occur, $M_A$ and $M_B$. The transverse magnetization $M_A$ is phase modulated by both the $U_A$ and $U_B$ bi-polar magnetic field gradients and the transverse magnetization $M_B$ is subject only to phase modulation by the bi-polar magnetic field gradient $U_B$. The resulting FID signal includes components produced by each of these transverse magnetizations $M_A$ and $M_B$.

$$S_1(t) = M_A(O)e^{2\pi i(U_A - U_B)v} - M_B(O)e^{-2\pi i U_B v}$$

Formula where:
$M_A(O)$ = initial magnetization due to $B_{1A}$
$M_B(O)$ = initial magnetization to $B_{1B}$
v = velocity of gyromagnetic material in the direction of bi-polar field gradient With $B_{1A}$ equal to $B_{1B}$ the initial magnetizations $M_A(O)$ and $M_B(O)$ are equal, and with $U_A = 2U_B$, the FID signal produced during the first sequence may be expressed as follows:

$$S_1(t) = |M_A|2 \sin(2\pi U_B v)$$

Similarly, during the second sequence the FID signal includes components produced by each of the transverse magnetizations $M_A$ and $M_B$.

$$S_2(t) = M_A(O)e^{2\pi i(U_A - U_B)v} + M_B(O)e^{-2\pi i U_B v}$$

This may be expressed as follows with $M_A(O) = M_B(O)$ and $U_A = 2U_B$:

$$S_2(t) = |M_A|2 \cos(2\pi U_B v)$$

The strength of the bi-polar magnetic field gradients can be changed also so that the velocity sensitizing variables $U_A$ and $U_B$ can be controlled to provide velocity distribution information. The FID signals $S_1(t)$ and $S_2(t)$ are thus also a function of $U_A$ and $U_B$. For notational simplicity, however, the variable "U" is an implicit, unwritten variable in the following discussion.

Images may be reconstructed from the data files $S_1(t)$ and $S_2(t)$ which employ both the spatial-position encoded information and the velocity distribution encoded information. A multi-dimensional Fourier transform is employed for this reconstruction, and because this transform is linearly additive with respect to the encoded variables "u" and "t", it makes no difference which image is reconstructed first. In the following description the spatial-position information is reconstructed first and then the velocity distribution information is reconstructed.

The spatial-position information can be extracted and used to produce an image using the processing technique described in my U.S. Pat. No. 4,516,075. More specifically, a data file pair S(t) is created where:

$$S(t) = S_2(t) + iS_1(t) \tag{1}$$

This may be written as the spectral transform:

$$S(t) = K \int m(w)e^{iwt} dw, \tag{2}$$

$$w = w(\text{Larmor}) - w_{rf}$$

and K is a constant electronic conversion factor. This signal has been spacially modulated by the field gradient $(G = G_x x\ G_y y\ G_z z)$ and is equivalent to the following:

$$S(t) = \int M_1(r)e^{-2\pi i \gamma \vec{G} \cdot \vec{r}} dr \tag{3}$$

where:
$M_1$ = transverse magnetization
r = a position (x, y, z)
$\gamma$ = magnetogyric constant.

This can be expressed in "q" space as:

$$S(q) = K \int M_1(r)e^{-2\pi i \vec{q} \cdot \vec{r}} dr \tag{4}$$

Where: "q" is a position in three-dimensional space which is determined by the field gradient G, $q = \gamma Gt$.

Each measurement cycle thus produces a line sampling in q-space, and the data files $S_1(t)$ and $S_2(t)$ represent a set of such line samplings. An image $I_m(r)$ can be reconstructed from this data by performing a numerical discrete Fourier inversion to the desired geometry:

$$I_m(\vec{r}) = K \int H(q)S(q)e^{2\pi i \vec{q} \cdot \vec{r}} dq \tag{5}$$

Where: H(q) is the apodizing function associated with the digitizing process.

When the Fourier inversion is performed according to equation (5) by the processor 22, two data files are created, I(r) and iJ(r), where:

$$I_m(r) = I(r) + iJ(r). \tag{6}$$

The image data in the file $I_m(r)$ may be output to a display device, such as the CRT 27 in FIG. 3, to produce an image.

To provide an image data file which indicates the density of paramagnetic nuclei traveling at velocity "v" at each spatial position "r", a set of measurement cycles are conducted in which the value of u is incremented through a range in integer steps, $$u = nU$$

where
n = 0, 1, 2, 3, ... N
U = incremental step which is smaller than the inverse of the maximum velocity occurring in the subject
N = number of intervals into which the velocity distribution is resolved.

An image data file can then be created by performing a Fourier transform with respect to the variable "u".

$$I_v(r,v) = \int_{-NU}^{+NU} I_m(u,r)e^{iuv} du \tag{7}$$

The data file $I_v(r,v)$ is a multi-dimensional image array giving at position "r", the density of paramagnetic nuclei moving within an interval (1/NU) centered at velocity "v". The real and imaginary parts of this data file can be combined by the square root of the sum of the squares of the parts to provide image data which may be output to the CRT 27 (FIG. 3).

This image indicates by the intensity of each pixel on the CRT screen 27 the velocity of the gyromagnetic material at the position of the pixel. For example, the image may be a cross section through a patient's leg, with the motion sensitizing, bi-polar magnetic field gradient directed along the lengthwise dimension of the leg (Z axis). In such case the image produced on the CRT display 27 indicates the location of arteries and veins which are either darkened areas to indicate flow in one direction (−Z) or are brightened areas to indicate flow in the other direction (Z). The large mass of stationary gyromagnetic material in bones, muscle and other tissues appears gray. Similar images can be produced with the motion sensitizing magnetic field gradient oriented in other directions to detect blood flowing in those directions at selected locations in the patient.

The present invention offers a number of advantages over prior motion imaging techniques. First, only the moving gyromagnetic material produces a FID signal when the motion sensitizing sequence of the present invention is employed. This is in contrast to prior techniques in which flow information is imbedded in the FID signal as a small component which must be extracted from the much larger components produced by the stationary gyromagnetic material.

In addition, the motion information modulates the amplitude of the FID signal rather that its phase when the present invention is employed. Thus, when spurious phase errors are produced by the NMR scanner, they do not significantly affect the quality of the flow images.

Figure 5A:
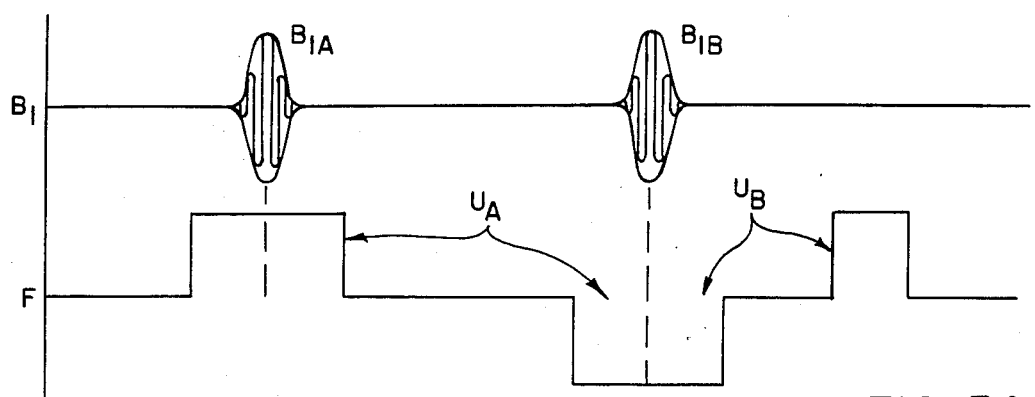
FIGS. 5A–5C are graphic illustrations of alternative measurement cycles performed according to the present invention.

A number of variations are possible in the sequence of FIG. 4 which will produce the same results. Referring particularly to FIG. 5A, for example, the excitation field pulses can be timed to occur during the application of the velocity sensitizing, magnetic field gradient F. The velocity sensitizing field gradients $U_A$ and $U_B$ are the same, but the excitation pulses $B_{1A}$ and $B_{1B}$ create "selective" slices of velocity-sensitized signals. Note that the integral of $U_A$ is zero as is the integral of $U_B$. That portion of the magnetic field gradient F which is applied before the $B_{1A}$ excitation pulse has no effect on the motion sensitization.

Figure 5B:
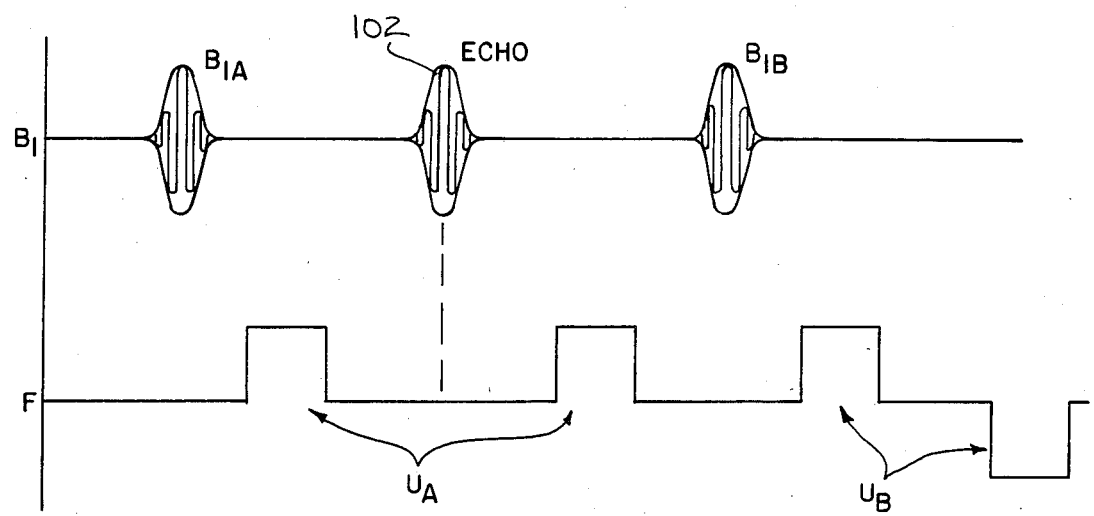

As indicated in my U.S. Pat. No. 4,516,075 the bi-polar nature of the motion sensitizing magnetic field gradient F may be achieved in two ways. First, as shown in FIGS. 4 and 5A, the direction of the magnetic field gradient F may be reversed by reversing the direction of current flowing in the gradient coils 10–12. In the alternative, the phase-polarity of the gyromagnetic material may be reversed by applying an "echo" pulse of excitation field energy which tips the magnetic moment of the material through 180 degrees. This is illustrated in FIG. 5B where the echo pulse 102 appears midway between the two parts of the magnetic field gradient $U_A$. The echo pulse 102 enables the polarity of the second part of $U_A$ to remain unchanged while the effect of the magnetic field gradient on the gyromagnetic material is bi-polar as required by the present invention. Note also, that the "conventional" bi-polar magnetic field gradient $U_B$ is reversed in polarity from that shown in FIG. 5A. This is necessary because the phase-angle of excited magnetization was reversed by the echo pulse 102. For the same reason, the encoding-polarity of the FID signal produced after this sequence is reversed and must be inverted to indicate correctly the direction of motion.

The concept which underlies the present invention is that the magnetization is first tipped away from the Z axis towards the transverse plane by the first excitation pulse $B_{1A}$. The magnetization is then motion sensitized with a bi-polar magnetic field gradient $U_A$ and then tripped back to the Z axis by the second excitation pulse $B_{1B}$. The transverse magnetic moment which remains after this sequence is completed is due to motion of the gyromagnetic material. The amplitude of the FID signal which results is, therefore, a measure of the motion. When small tip angles are employed in the sequence, the second excitation pulse $B_{1B}$ does not precisely tip the stationary magnetization back to the Z axis and an error is introduced into the FID signal. The second bi-polar magnetic field gradient $U_B$ corrects this error. As the tip angle is increased, this error diminishes and at a ninety degree tip angle the error is zero. As a result, when the magnetization is tipped ninety degrees by the first excitation pulse $B_{1A}$ and restored ninety degrees by the second excitation pulse $B_{1B}$, there is no need for the second bi-polar magnetic field gradient $U_B$.

Figure 5C:
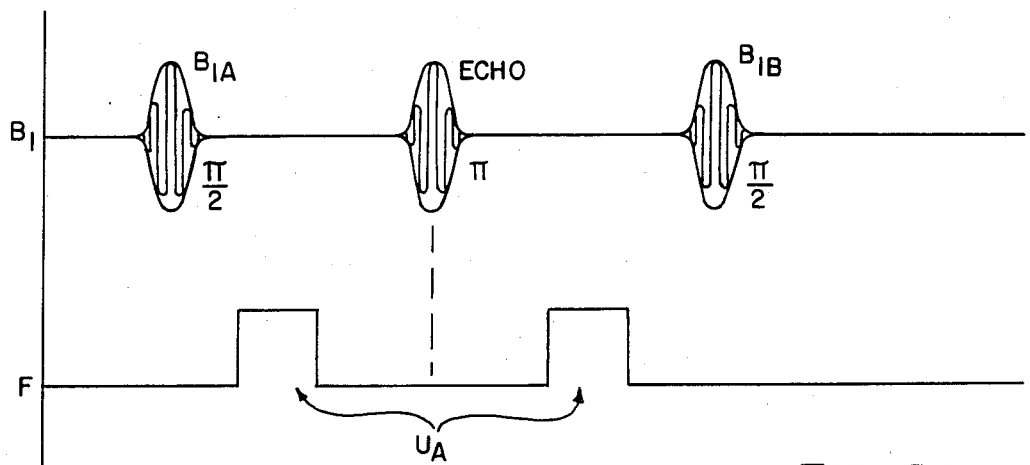

Such a sequence is illustrated in FIG. 5C where the $B_{1A}$ pulse tips the magnetization ninety degrees, the echo pulse reverses the magnetization (i.e. 180 degrees), and the $B_{1B}$ pulse restores the stationary magnetization back to the Z axis. The bi-polar magnetic field gradient $U_A$ is applied between the pulses $B_{1A}$ and $B_{1B}$ to motion sensitize the FID signal which is produced after this sequence is complete. The $S_1(t)$ and $S_2(t)$ FID signals described above may be produced by this sequence using a number of variations in the phase of the radio frequency excitation signals which form the pulses $B_{1A}$, $B_{1B}$ and the echo pulse. If the phase of the echo pulse is ninety degress, the $S_1(t)$ FID signal can be produced with any of the following:

$B_{1A} = +90$ degrees
$B_{1A} = 0$ degrees
$B_{1A} = 0$ degrees
$B_{1B} = --90$ degrees
$B_{1B} = 180$ degrees
$B_{1B} = 0$ degrees (negative signal).

If the echo pulse has a phase of zero degrees, then the $S_1(t)$ FID signal is produced when the $B_{1A}$ and $B_{1B}$ pulses have the same phase.

The $S_2(t)$ FID signal may be produced when the echo pulse has either a zero or a ninety degree phase, the $B_{1A}$ pulse has zero degree phase, and the $B_{1B}$ pulse has a phase of either plus or minus ninety degrees.

While the use of sequences which employ small tip angles has a number of advantages, the use of the large, ninety degree tip angles in the sequence of FIG. 5C has a unique practical advantage. As stated above, the present invention requires that the second excitation pulse $B_{1B}$ restore the stationary magnetization to the Z axis. In the sequences shown, this is accomplished with a second excitation pulse having the proper amplitude, duration and phase. This also presumes that the measurement parameters, such as the polarizing magnetic field strength $B_0$, remain constant and precisely on-resonance everywhere in space during the time period between the two excitation pulses $B_{1A}$ and $B_{1B}$. Any drift in these parameters will introduce an error which will produce artifacts in the image. The echo pulse situated midway between the excitation pulses $B_{1A}$ and $B_{1B}$ in FIG. 5C eliminates such errors and makes this sequence particularly useful.

I claim:

1. In a gyromagnetic resonance instrument which performs a measurement cycle in which a FID signal produced by gyromagnetic material which is subjected to a polarizing magnetic field and has a magnetic moment is detected and processed to produce an indication of the amount of magnetization, the improvement comprising:

excitation means for applying an excitation field to the gyromagnetic material at the Larmor frequency of the gyromagnetic material and at a controllable strength and phase;

magnetic field gradient means for applying a magnetic field to the gyromagnetic material which has a gradient in a controlled direction; and control means coupled to the excitation means and the magnetic field gradient means and being operable to perform a measurement cycle that produces a FID signal indicative of the motion of gyromagnetic material, the measurement cycle including:

(a) applying a first excitation field pulse which tips the net magnetic moment of the gyromagnetic material away from the direction of the polarizing magnetic field;

(b) applying a motion sensitizing magnetic field gradient to the gyromagnetic material which has alternating polarity with respect to the net magnetic moment of the gyromagnetic material and in which the gradient is oriented to the direction in which motion is to be measured;

(c) applying a second excitation field pulse having a strength and phase which substantially restores the magnetic moment of stationary gyromagnetic material to the direction of the polarizing magnetic field.

2. The improvement as recited in claim 1 in which the measurement cycle also includes:

(d) applying a second motion sensitizing magnetic field gradient to the gyromagnetic material after the application of the second excitation field pulse, said second motion sensitizing magnetic field gradient having alternating polarity with respect to the net magnetic moment of the gyromagnetic material and in which its gradient is oriented in the direction which motion is to be measured.

3. The improvement as recited in claim 1 in which the motion sensitizing magnetic field gradient is reversed in direction to provide said alternating polarity with respect to the net magnetic moment of the gyromagnetic material.

4. The improvement as recited in claim 1 in which the motion sensitizing magnetic field gradient remains fixed in direction and the net magnetic moment of the gyromagnetic material is reversed in direction by the application of an excitation field echo pulse to provide said alternating polarity.

5. The improvement as recited in claim 1 in which each of the excitation field pulses tip the magnetic moment of the gyromagnetic material substantially ninety degrees.

6. The improvement as recited in claim 5 in which the motion sensitizing magnetic field gradient remains fixed in direction and the magnetic moment of the gyromagnetic material is reversed in direction by the application of an excitation field echo pulse to provide said alternating polarity.

7. The improvement as recited in claim 6 in which the echo pulse is applied midway between the application of said first and second excitation field pulses.

8. The method as recited in claim 1 in which magnetic field gradients are applied to the gyromagnetic material to select a location in said material from which the FID signal is produced.

9. A method of producing a FID signal in a gyromagnetic resonance instrument which indicates by its amplitude the motion of gyromagnetic material in a designated direction, the steps comprising:

applying a polarizing magnetic field to the gyromagnetic material which aligns its magnetic moment along a polarizing axis;

applying a first excitation field pulse to the gyromagnetic material which tips the net magnetic moment thereof away from the polarizing axis;

applying a motion sensitizing magnetic field gradient to the gyromagnetic material which has alternating polarity with respect to the net magnetic moment of the gyromagnetic material and in which the gradient is oriented in said designated direction;

applying a second excitation field pulse to the gyromagnetic material which has a strength and phase that substantially restores the magnetic moment of stationary gyromagnetic material to the direction of the polarizing axis; and receiving a FID signal produced by moving gyromagnetic material which retains a component of magnetization after the above steps which is not aligned in the direction of the polarizing axis.

10. The method as recited in claim 9 in which a second motion sensitizing magnetic field gradient is applied to the gyromagnetic material after said second excitation field pulse and prior to receiving said FID signal, said second motion sensitizing magnetic field gradient having alternating polarity with respect to the net magnetic moment of the gyromagnetic material and its gradient being directed in said designated direction.

11. The method as recited in claim 9 in which the motion sensitizing magnetic field gradient remains fixed in direction and the net magnetic moment of the gyromagnetic material is reversed in direction by the application of an excitation field echo pulse to provide said alternating polarity.

* * * * *